US006323355B2

(12) United States Patent
Igarashi

(10) Patent No.: US 6,323,355 B2
(45) Date of Patent: Nov. 27, 2001

(54) SPECIFIC VINYLSILANE COMPOUND, ORGANIC LUMINOUS ELEMENT CONTAINING THE SAME, AND METHOD FOR PRODUCING VINYLSILANE COMPOUND

(75) Inventor: Tatsuya Igarashi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/785,257

(22) Filed: Feb. 20, 2001

Related U.S. Application Data

(62) Division of application No. 09/299,657, filed on Apr. 27, 1999, now Pat. No. 6,232,001.

(30) Foreign Application Priority Data

Apr. 30, 1998 (JP) .................................................. 10-120843
Mar. 18, 1999 (JP) .................................................. 11-74160

(51) Int. Cl.$^7$ ................................. C07F 7/08; C07F 7/10
(52) U.S. Cl. .......................... 556/431; 556/413; 556/432; 556/489; 546/14; 549/4; 548/110; 548/406
(58) Field of Search ...................... 556/431, 432, 556/413, 489; 546/14; 549/4; 548/110, 406

(56) References Cited

U.S. PATENT DOCUMENTS

| | | |
|---|---|---|
| 5,432,014 | 7/1995 | Sano et al. . |
| 5,449,564 | 9/1995 | Nishio et al. . |
| 5,523,441 * | 6/1996 | Jung et al. ............................ 556/431 |
| 5,529,853 | 6/1996 | Hamada et al. . |
| 5,601,903 | 2/1997 | Fujii et al. . |
| 5,605,991 * | 2/1997 | Chamberlain et al. .......... 556/431 X |
| 5,674,597 | 10/1997 | Fujii et al. . |
| 5,792,557 | 8/1998 | Nakaya et al. . |
| 5,837,391 | 11/1998 | Utsugi et al. . |
| 5,858,564 | 1/1999 | Tamura et al. . |
| 6,127,565 * | 10/2000 | Dougherty ....................... 556/431 X |
| 6,157,127 | 12/2000 | Hosokawa et al. . |
| 6,165,383 * | 12/2000 | Chou ................................ 556/431 X |
| 6,232,001 * | 5/2001 | Igarashi ............................... 428/690 |

OTHER PUBLICATIONS

Polymer Preprints, vol. 39, No. 1, Mar. 1998, p. 89, "Synthesis and Photophysics of Silylenetethered Divinylarene Copolymers".

J. Am. Chemical Society, No. 118, 1996, pp. 11974–11975, "Silole Derivatives as Efficient Electron Transporting Materials".

* cited by examiner

*Primary Examiner*—Paul F. Shaver
(74) *Attorney, Agent, or Firm*—Sughrue, Mion, Zinn, Macpeak & Seas, PLLC

(57) ABSTRACT

A high-efficiency organic luminous element by which blue luminescence with high luminance and high color purity becomes possible, which comprises at least one compound represented by general formula (A):

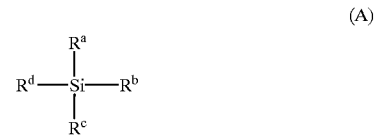

(A)

wherein $R^a$, $R^b$, $R^c$ and $R^d$ each represents a hydrogen atom or a substituent group, with the proviso that at least one substituent group of $R^a$, $R^b$, $R^c$ and $R^d$ is a group represented by general formula (B):

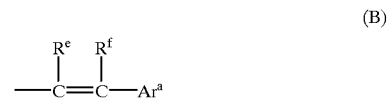

(B)

wherein $R^e$ and $R^f$ each represents a hydrogen atom or a substituent group, and $Ar^a$ represents an aryl group, a heteroaryl group or an alkenyl group; and when at least two substituent groups of $R^a$, $R^b$, $R^c$ and $R^d$ are groups represented by general formula (B), the groups represented by general formula (B) may be the same or different.

4 Claims, No Drawings

SPECIFIC VINYLSILANE COMPOUND, ORGANIC LUMINOUS ELEMENT CONTAINING THE SAME, AND METHOD FOR PRODUCING VINYLSILANE COMPOUND

This is a divisional of application Ser. No. 09/299,657 (Confirmation No. Unknown) filed Apr. 27, 1999, now U.S. Pat. No. 6,232,001 the disclosure of which is incorporated herein by reference.

FIELD OF THE INVENTION

The present invention relates to a vinylsilane compound and an organic luminous element containing the same, and a method for producing a vinylsilane compound.

BACKGROUND OF THE INVENTION

At present, the research and development of various display elements using organic luminous materials (organic luminous elements) have been actively made, and particularly, organic EL (electroluminescence) elements have received attention as promising display elements because high-intensity luminescence can be obtained at low voltage. For example, EL elements have been known in which organic thin layers are formed by vapor deposition of organic compounds (*Applied Physics Letters*, 51, 913 (1987)). The organic EL elements described therein have the laminated structure of electron-transporting materials and hole-transporting materials, and the luminescence characteristics thereof are significantly improved, compared with conventional monolayer type elements.

With this report as a turning point, the research and development of organic EL elements have become active, and the development of electron-transporting materials and hole-transporting materials for improving the efficiency have been variously studied. However, in the development of electron-transporting materials, no compound having a performance exceeding that of Alq (tris(8-hydroxyquinolinato)aluminum) has been discovered yet, so that the improvement thereof has been desired. Further, Alq is unsuitable for electron-transporting materials for blue luminous elements because of its green fluorescence. In this respect, therefore, development has also been desired.

On the other hand, recently, applications of organic EL elements to full-color displays have been actively studied. For developing high performance full-color displays, it is necessary to heighten the luminous color purity of each of the blue, green and red colors. However, it is difficult to obtain luminescence of high color purity. For example, distyrylarylene compounds (DPVBI) described in *Organic EL Elements and Forefront of Industrialization Thereof*, page 38 (N. T. S. Co.) and benzo cyclocondensed nitrogen-containing heterocyclic compounds (Zn(OXZ)$_2$) described in *Organic EL Elements and Forefront of Industrialization Thereof*, page 40 (N. T. S. Co.) and JP-A-7-133483 (the term "JP-A" as used herein means an "unexamined published Japanese patent application") are blue luminous materials widely studied. However, only blue luminescence of low color purity is obtained, so that the improvement thereof has been desired.

SUMMARY OF THE INVENTION

It is, therefore, an object of the present invention to provide a material for a high-efficiency organic luminous element, and particularly, an electron-transporting material or a luminous material, by which blue luminescence with high luminance and high color purity becomes possible.

Another object of the present invention is to provide a luminous element.

Other objects and effects of the present invention will become apparent form the following description.

The present invention relates to an organic luminous element containing at least one compound represented by general formula (A):

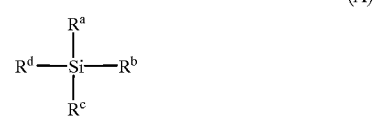

(A)

wherein $R^a$, $R^b$, $R^c$ and $R^d$ each represents a hydrogen atom or a substituent group, with the proviso that at least one substituent group of $R^a$, $R^b$, $R^c$ and $R^d$ is a group represented by general formula (B):

(B)

wherein $R^e$ and $R^f$ each represents a hydrogen atom or a substituent group, and $Ar^a$ represents an aryl group, a heteroaryl group or an alkenyl group; and when at least two substituent groups of $R^a$, $R^b$, $R^c$ and $R^d$ are groups represented by general formula (B), the groups represented by general formula (B) may be the same or different.

In particular, the present invention relates to the following embodiments.

(1) An organic luminous element material comprising a compound having a partial structure represented by general formula (1):

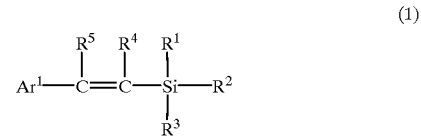

(1)

wherein $R^1$, $R^2$ and $R^3$ each represents a hydrogen atom or a substituent group, with the proviso that $R^1$, $R^2$ and $R^3$ are not alkenyl groups; $R^4$ and $R^5$ each represents a hydrogen atom or a substituent group; and $Ar^1$ represents an aryl group, a heteroaryl group or an alkenyl group.

(2) An organic luminous element comprising at least one compound having the partial structure represented by general formula (1) as described in the above (1).

(3) An organic luminous element material comprising a compound having only one partial structure represented by general formula (2):

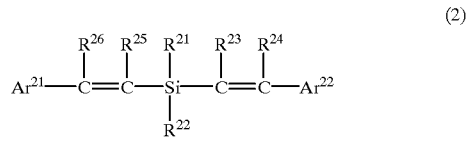

(2)

wherein $R^{21}$ and $R^{22}$ each represents a hydrogen atom or a substituent group; $R^{23}$, $R^{24}$, $R^{25}$ and $R^{26}$ each represents a hydrogen atom or a substituent group; and $Ar^{21}$ and $Ar^{22}$ each represents an aryl group, a heteroaryl group or an alkenyl group.

(4) An organic luminous element comprising at least one compound having only one partial structure represented by general formula (2) as described in the above (3).

(5) An organic luminous element material comprising a compound having at least two partial structures represented by general formula (3):

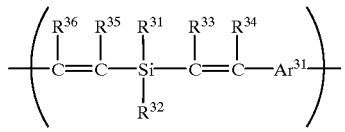

(3)

wherein $R^{31}$ represents an aryl group, a heteroaryl group, an alkenyl group or an alkynyl group; $R^{32}$ represents a hydrogen atom or a substituent group; $R^{33}$, $R^{34}$, $R^{35}$ and $R^{36}$ each represents a hydrogen atom or a substituent group; and $Ar^{31}$ represents an arylene group, a heteroarylene group or an alkenylene group.

(6) An organic luminous element comprising at least one compound having at least two partial structures represented by general formula (3) as described in the above (5).

(7) A compound represented by general formula (4):

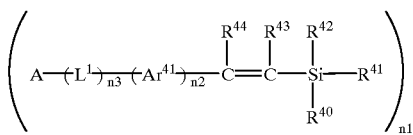

(4)

wherein $R^{40}$, $R^{41}$, $R^{42}$, $R^{43}$ and $R^{44}$ each represents a hydrogen atom or a substituent group; $Ar^{41}$ represents an arylene group, a heteroarylene group or an alkenylene group; $L^1$ represents a divalent connecting group; A represents a connecting group; $n^1$ represents an integer of 2 or more; when $n^1$ is 2, A may be connected through single bonds; a plurality of substituent groups (groups each having a vinylsilyl structure) connected to A may be the same or different; $n^2$ represents 0 or 1, with the proviso that only when A is an aryl connecting group, a heteroaryl connecting group or an alkenyl connecting group and $n^3$ is 0, $n^2$ can be 0; and $n^3$ represents an integer of 0 or more.

(8) A compound comprising at least two partial structures represented by general formula (5):

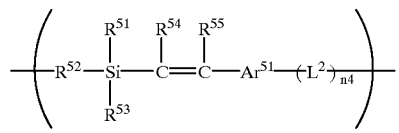

(5)

wherein $R^{51}$ and $R^{53}$ each represents a hydrogen atom or a substituent group; $R^{52}$ represents a divalent connecting group; $R^{54}$ and $R^{55}$ each represents a hydrogen atom or a substituent group; $Ar^{51}$ represents an arylene group, a heteroarylene group or an alkenylene group; $L^2$ represents a divalent connecting group; and $n^4$ represents an integer of 0 or more.

(9) A compound containing:
at least one partial structure represented by general formula (1):

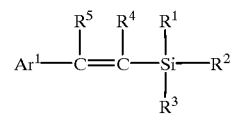

(1)

wherein $R^1$, $R^2$ and $R^3$ each represents a hydrogen atom or a substituent group, with the proviso that $R^1$, $R^2$ and $R^3$ are not alkenyl groups; $R^4$ and $R^5$ each represents a hydrogen atom or a substituent group; and $Ar^1$ represents an aryl group, a heteroaryl group or an alkenyl group; and at lease one partial structure represented by general formula (6):

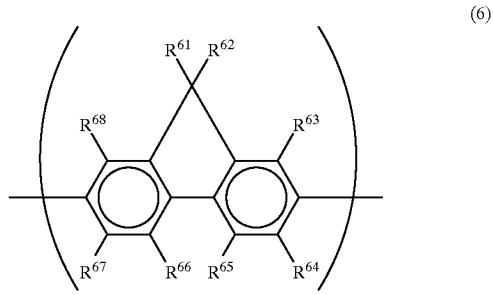

(6)

wherein $R^{61}$, $R^{62}$, $R^{63}$, $R^{64}$, $R^{65}$, $R^{66}$, $R^{67}$ and $R^{68}$ each represents a hydrogen atom or a substituent group.

(10) A method for producing a vinylsilane compound, which comprises:
reacting a vinylsilane derivative with an aryl halide derivative, a heteroaryl halide derivative, a trifluoromethanesulfonylaryl derivative or a trifluoromethanesulfonylheteroaryl derivative in the presence of a palladium catalyst to form a carbon-carbon bond, to thereby obtain a compound represented by general formula (A):

(A)

wherein $R^a$, $R^b$, $R^c$ and $R^d$ each represents a hydrogen atom or a substituent group, with the proviso that at least one substituent group of $R^a$, $R^b$, $R^c$ and $R^d$ is a group represented by general formula (B):

(B)

wherein $R^e$ and $R^f$ each represents a hydrogen atom or a substituent group, and Ar represents an aryl group, a heteroaryl group or an alkenyl group; and when at least two substituent groups of $R^a$, $R^b$, $R^c$ and $R^d$ are groups represented by general formula (B), the groups represented by general formula (B) may he the same or different.

DETAILED DEESCRIPTION OF THE INVENTION

The compounds for use in the present invention are described below.

First, general formulas (A) and (B) are described in detail.

$R^a$, $R^b$, $R^c$ and $R^d$ each represents a hydrogen atom or a substituent group, with the proviso that at least one substituent group of $R^a$, $R^b$, $R^c$ and $R^d$ is a group represented by general formula (B). When at least two substituent groups of $R^a$, $R^b$, $R^c$ and $R^d$ are groups represented by general formula (B), the groups represented by general formula (B) may be the same or different. Examples of the substituent groups of $R^a$, $R^b$, $R^c$ and $R^d$ include alkyl groups (each having preferably 1 to 30 carbon atoms, more preferably 1 to 12 carbon atoms, and still more preferably 1 to 6 carbon atoms, for example, methyl, t-butyl and hexyl), alkenyl groups (each having preferably 2 to 30 carbon atoms, more preferably 2 to 12 carbon atoms, and still more preferably 2 to 6 carbon atoms, for example, propenyl), alkynyl groups (each having preferably 2 to 30 carbon atoms, more preferably 2 to 12 carbon atoms, and still more preferably 2 to 6 carbon atoms, for example, ethynyl), aryl groups (each having preferably 6 to 40 carbon atoms, more preferably 6 to 20 carbon atoms, and still more preferably 6 to 12 carbon atoms, for example, phenyl, naphthyl and anthracenyl), heteroaryl groups (preferably containing oxygen, sulfur or nitrogen atoms, and each having preferably 1 to 40 carbon atoms, more preferably 2 to 20 carbon atoms, and still more preferably 3 to 12 carbon atoms, for example, pyridyl, thienyl and carbazoiyl), alkoxy groups (each having preferably 1 to 30 carbon atoms, more preferably 1 to 12 carbon atoms, and still more preferably 1 to 6 carbon atoms, for example, methoxy and isopropoxy), aryloxy groups (each having preferably 6 to 40 carbon atoms, more preferably 6 to 20 carbon atoms, and still more preferably 6 to 12 carbon atoms, for example, phenoxy, naphthoxy and pyrenyloxy), halogen atoms (for example chlorine, bromine and fluorine), heterocyclic groups (preferably containing oxygen, sulfur or nitrogen atoms, and each having preferably 1 to 40 carbon atoms, more preferably 2 to 20 carbon atoms, and still more preferably 3 to 12 carbon atoms, for example, piperidyl and morpholino), and silyl groups (each having preferably 1 to 30 carbon atoms, more preferably 3 to 20 carbon atoms, and still more preferably 3 to 12 carbon atoms, for example, trimethylsilyl, t-butyldimethylsilyl and triphenylsilyl). These substituent groups may further have substituent groups.

$R^a$, $R^b$, $R^c$ and $R^d$ are preferably alkyl groups, aryl groups, alkenyl groups (including the groups represented by general formula (B)), heteroaryl groups and alkoxy groups, and more preferably alkyl groups, aryl groups, alkenyl groups and heteroaryl groups.

$R^e$ and $R^f$ each represents a hydrogen atom or a substituent group. Examples of the substituent groups include alkyl groups, aryl groups, heteroaryl groups, heterocyclic groups and a cyano group. $R^e$ and $R^f$ are preferably alkyl groups, aryl groups, heteroaryl groups, cyano groups and hydrogen atoms, more preferably hydrogen atoms, alkyl groups and aryl groups, and still more preferably hydrogen atoms. $Ar^a$ represents an aryl group, a heteroaryl group or an alkenyl group. Preferred examples thereof include aryl groups and heteroaryl groups.

More preferred forms of the compounds represented by general formula (A) are compounds each having a partial structure represented by general formula (1), compounds each having only one partial structure represented by general formula (2), and compounds each having at least two partial structures represented by general formula (3). Each of these compounds preferably contains a partial structure represented by general formula (6) described below.

The compounds represented by general formula (A) may be low molecular weight compounds, high molecular weight compounds (polymers or oligomers, the weight average molecular weight is preferably from 1,000 to 5,000,000, more preferably from 2,000 to 1,000,000, and still more preferably from 3,000 to 500,000), or high molecular weight compounds having skeletons of general formula (A) in main chains (the weight average molecular weight is preferably from 1,000 to 5,000,000, more preferably from 2,000 to 1,000,000, and still more preferably from 3,000 to 500,000). The high molecular weight compounds may be either homopolymers or copolymers with other monomers.

The compound having at least one partial structure represented by general formula (1) are described.

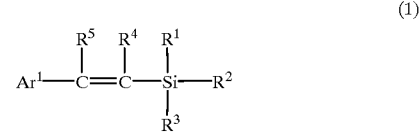

(1)

General formula (1) is described in detail below.

$R^1$, $R^2$ and $R^3$ each represents a hydrogen atom or a substituent group, with the proviso that $R^1$, $R^2$ and $R^3$ are not alkenyl groups. The substituent groups of $R^1$, $R^2$ and $R^3$ include, for example, alkyl groups (each having preferably 1 to 30 carbon atoms, more preferably 1 to 12 carbon atoms, and still more preferably 1 to 6 carbon atoms, for example, methyl, t-butyl, hexyl and cyclohexyl), alkynyl groups (each having preferably 2 to 30 carbon atoms, more preferably 2 to 12 carbon atoms, and still more preferably 2 to 6 carbon atoms, for example, ethynyl), aryl groups (each having preferably 6 to 40 carbon atoms, more preferably 6 to 20 carbon atoms, and still more preferably 6 to 12 carbon atoms, for example, phenyl, naphthyl and anthracenyl), heteroaryl groups (preferably containing oxygen, sulfur or nitrogen atoms, and each having preferably 1 to 40 carbon atoms, more preferably 2 to 20 carbon atoms, and still more preferably 3 to 12 carbon atoms, for example, pyridyl, thienyl and carbazolyl), alkoxy groups (each having preferably 1 to 30 carbon atoms, more preferably 1 to 12 carbon atoms, and still more preferably 1 to 6 carbon atoms, for example, methoxy and isopropoxy), aryloxy groups (each having preferably 6 to 40 carbon atoms, more preferably 6 to 20 carbon atoms, and still more preferably 6 to 12 carbon atoms, for example, phenoxy, naphthoxy and pyrenyloxy), heterocyclic groups (preferably containing oxygen, sulfur or nitrogen atoms, and each having preferably 1 to 40 carbon atoms, more preferably 2 to 20 carbon atoms, and still more preferably 3 to 12 carbon atoms, for example, piperidyl and morpholino), and silyl groups (each having preferably 1 to 30 carbon atoms, more preferably 3 to 20 carbon atoms, and still more preferably 3 to 12 carbon atoms, for example, trimethylsilyl, t-butyldimethylsilyl and triphenylsilyl). These substituent groups may further have substituent groups.

$R^1$, $R^2$ and $R^3$ are preferably alkyl groups, aryl groups, heteroaryl groups and alkoxy groups, more preferably alkyl groups, aryl groups and heteroaryl groups, and particularly preferably aryl groups.

$R^4$ and $R^5$ each represents a hydrogen atom or a substituent group. Examples of the substituent groups include alkyl groups, aryl groups, heteroaryl groups, heterocyclic groups and a cyano group. $R^4$ and $R^5$ are preferably alkyl groups, aryl groups, heteroaryl groups, cyano groups and hydrogen atoms, more preferably hydrogen atoms, alkyl groups and aryl groups, and still more preferably hydrogen atoms.

$Ar^1$ represents an aryl group, a heteroaryl group or an alkenyl group. Examples thereof are preferably aryl groups and heteroaryl groups, and more preferably aryl groups.

The compounds each having the partial structure represented by general formula (1) may be low molecular weight compounds, high molecular weight compounds in which residues represented by general formula (1) are connected to main chains (polymers or oligomers, the weight average molecular weight is preferably from 1,000 to 5,000,000, more preferably from 2,000 to 1,000,000, and still more preferably from 3,000 to 500,000), or high molecular weight compounds having skeletons of general formula (1) in main chains (the weight average molecular weight is preferably from 1,000 to 5,000,000, more preferably from 2,000 to 1,000,000, and still more preferably from 3,000 to 500,000). The high molecular weight compounds may be either homopolymers or copolymers with other monomers.

The compounds each having the partial structure represented by general formula (1) are preferably low molecular weight compounds or compounds each having the partial structure represented by general formula (1) in a main chain, and more preferably compounds each having the partial structure represented by general formula (1) in a main chain.

Preferred forms of the compounds each having the partial structure represented by general formula (1) are compounds represented by general formula (4) or compounds each having at least two partial structures represented by general formula (5). Each of these compounds preferably contains a partial structure represented by general formula (6) described below. The compounds may each has both the partial structure represented by general formula (6) and the partial structure represented by general formula (1).

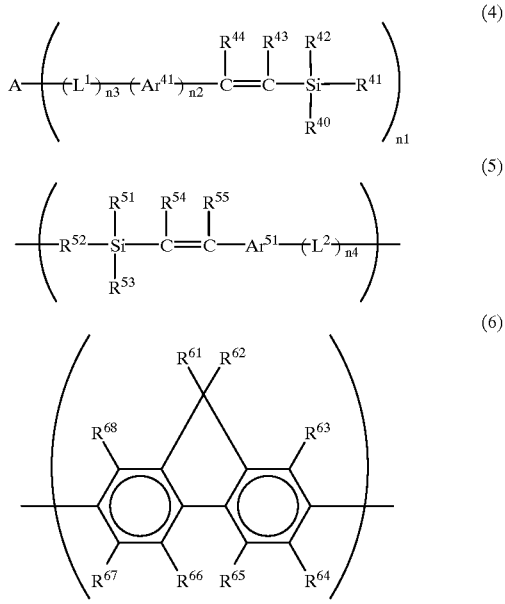

Then, general formula (4) is described below.

$R^{40}$, $R^{41}$ and $R^{43}$ each has the same meaning as $R^1$ described above. $R^{43}$: and $R^{44}$ each has the same meaning as $R^4$ described above. $n^1$ represents an integer of 2 or more. When $n^1$ is 2, A may be a single bond. A plurality of substituent groups (groups each having a vinylsilyl structure) connected to A may be the same or different. $n^1$ is preferably from 2 to 4, more preferably 2 or 3, and still more preferably 2.

$Ar^{41}$ represents an arylene group (each having preferably 6 to 40 carbon atoms, more preferably 6 to 20 carbon atoms, and still more preferably 6 to 12 carbon atoms, for example, phenylene, naphthylene and anthracenylene), heteroarylene groups (preferably containing oxygen, sulfur or nitrogen atoms, and each having preferably 1 to 40 carbon atoms, more preferably 2 to 20 carbon atoms, and still more preferably 3 to 12 carbon atoms, for example, pyridylene, thienylene and carbazolylene) or an alkenylene group (having preferably 2 to 20 carbon atoms, more preferably 2 to 12, and still more preferably 2 to 8, for example, vinylene, allylene, 2-butenylene and 3-pentenylene). These substituent groups may further have substituent groups.

$Ar^{41}$ is preferably an arylene group or a heteroarylene group, more preferably an arylene group, still more preferably phenylene, and particularly preferably unsubstituted phenylene.

$n^2$ represents 0 or 1, with the proviso that only when A is an aryl connecting group, a heteroaryl connecting group or an alkenyl connecting group, and $n^3$ is 0, $n^2$ can be 0. $n^2$ is preferably 1.

$L^1$ represents a divalent connecting group, and $n^3$ represents an integer of 0 or more. When $n^3$ is 2 or more, the respective groups represented by $L^1$ may be the same or different. The carbon number of an —$(L^1)n^3$— group is preferably from 0 to 40, more preferably from 0 to 24, and particularly preferably from 0 to 12. The divalent connecting groups include, for example, substituted or unsubstituted alkylene groups (for example, methylene, ethylene and cyclohexylene), alkenylene groups (for example, vinylene and methylvinylene), alkynylene groups (for example, ethynylene), arylene groups (for example, phenylene, naphthylene and anthracenylene), silylene groups (for example, dimethylsilylene and diphenylsilylene), —O—, —S—, —C(=O)—, —N(R)— (R represents a group substitutable on nitrogen) and heteroarylene groups (for example, pyridylene and thienylene).

$L^1$ is preferably a substituted or unsubstituted alkylene, arylene, heteroarylene, alkenylene or silylene group, more preferably a substituted or unsubstituted arylene, alkenylene or heteroarylene group, still more preferably an arylene or alkenylene group, and particularly preferably phenylene or vinylene.

$n^3$ is preferably from 0 to 5, more preferably 0 or 1, and particularly preferably 0.

A represents a connecting group. Only when $n^1$ is 2, A can be a single bond. Although the valence of the connecting group varies depending on the number of $n^1$, it is preferably from 2 to 4, more preferably 2 or 3, and particularly preferably 2. Examples of the connecting groups include the divalent groups described for $L^1$ mentioned above, and connecting groups in which the valence thereof is changed. A is preferably a single bond, an alkyl connecting group, an aryl connecting group or a heteroaryl connecting group, more preferably a single bond or an aryl group, and particularly preferably a single bond.

Then, general formula (5) is described below.

$R^{51}$ and $R^{53}$ each has the same meaning as $R^1$ described above. $R^{52}$ is a divalent connecting group derived from a group having the same meaning as $R^1$ described above. $R^{54}$ and $R^{55}$ each has the same meaning as $R^4$ described above. $Ar^{51}$, $L^2$ and $n^4$ have the same meanings as $Ar^{41}$, $L^1$ and $n^3$ described above, respectively.

General formula (6) is described below.

$R^{61}$, $R^{62}$, $R^{63}$, $R^{64}$, $R^{65}$, $R^{66}$, $R^{67}$ and $R^{68}$ each represents a hydrogen atom or a substituent group. Examples of the substituent groups include the substituent groups described for $R^1$ mentioned above. $R^{61}$ and $R^{62}$ are each preferably a hydrogen atom, an alkyl group, an aryl group, a heteroaryl group or an alkoxy group, more preferably a hydrogen atom or alkyl group, and still more preferably an alkyl group. $R^{63}$, $R^{64}$, $R^{65}$, $R^{66}$, $R^{67}$ and $R^{68}$ are each preferably a hydrogen atom or an alkyl group, and more preferably a hydrogen atom.

Examples of the compounds each having the partial structure represented by general formula (1) are shown below, but the present invention is not limited thereto.

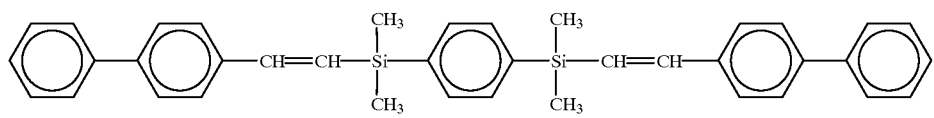

(1-1)

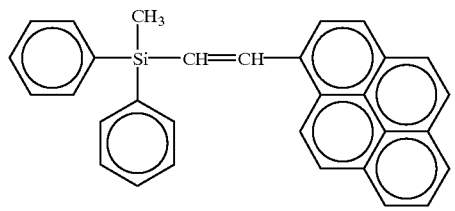

(1-2)

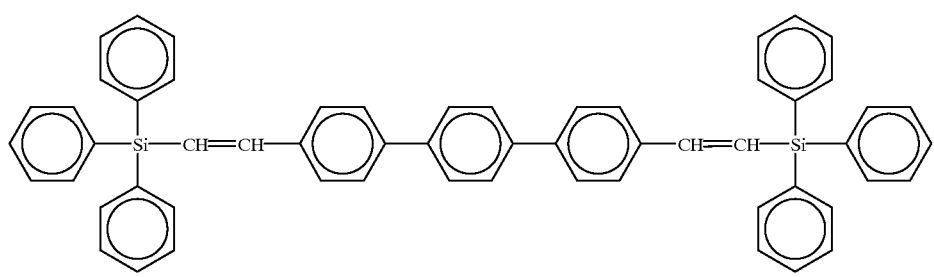

(1-3)

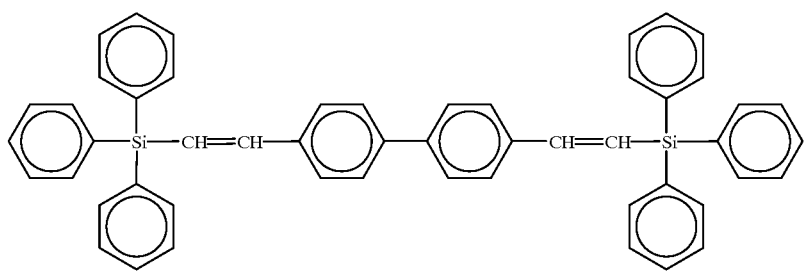

(1-4)

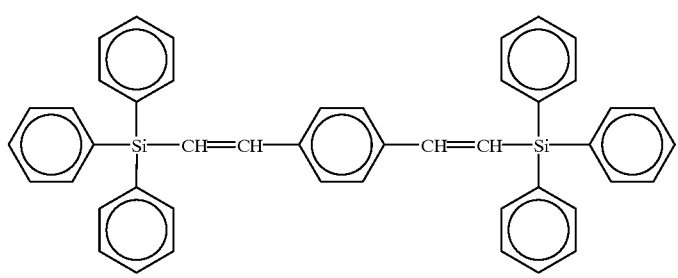

(1-5)

(1-6)
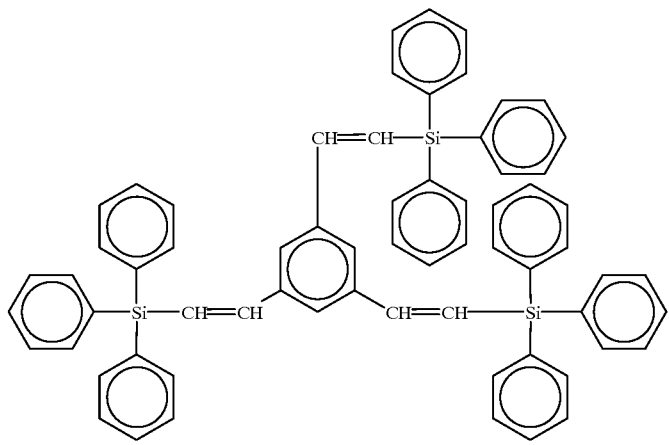
(1-7)
(1-8)
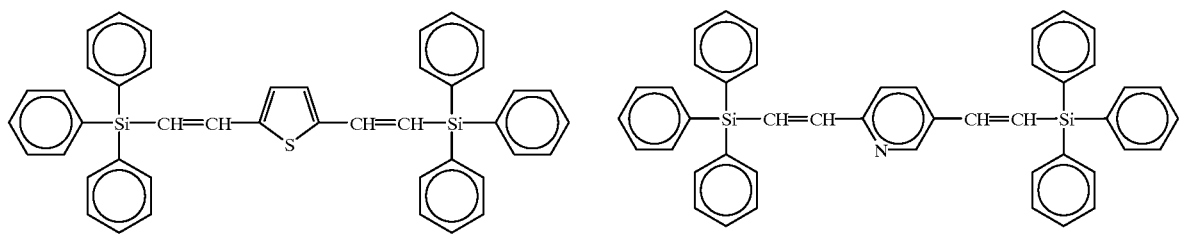
(1-9)
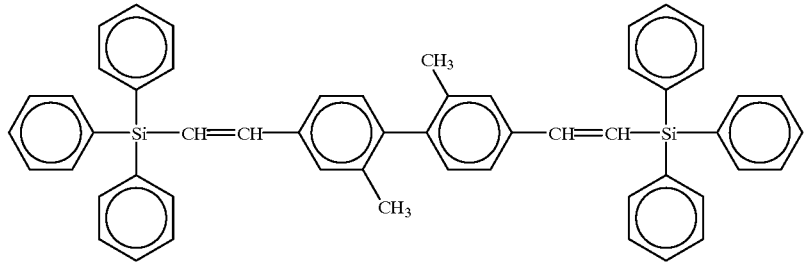
(1-10)
(1-11)
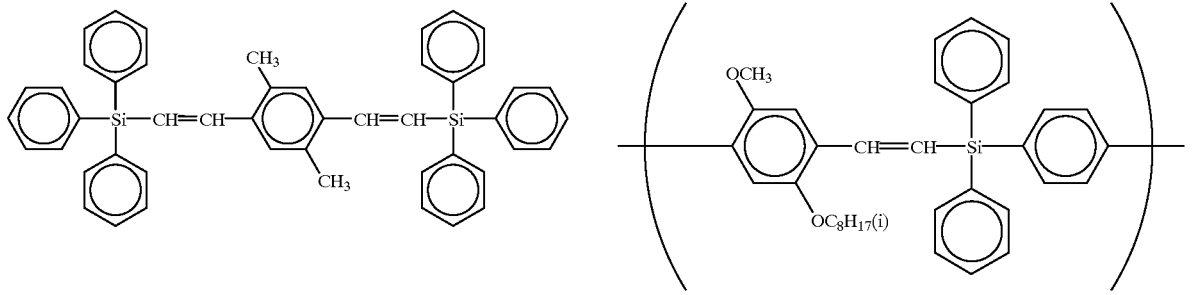
Mw = 7200 (in terms of polystyrene)

-continued
(1-12)
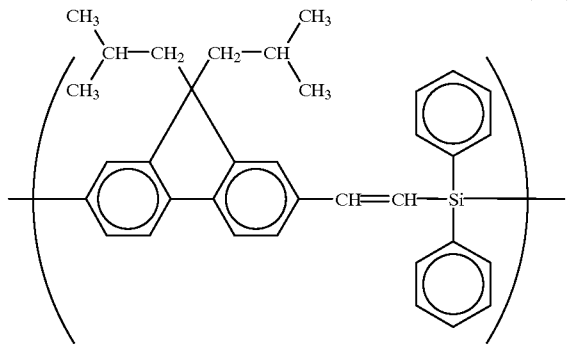
Mw = 4600
(1-13)
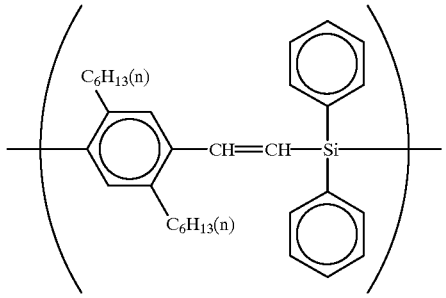
Mw = 5500
(1-14)
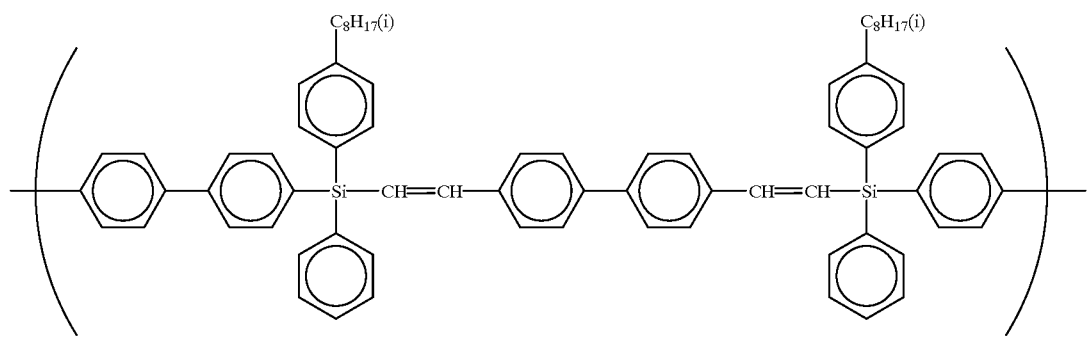
Mw = 9200
(1-15)
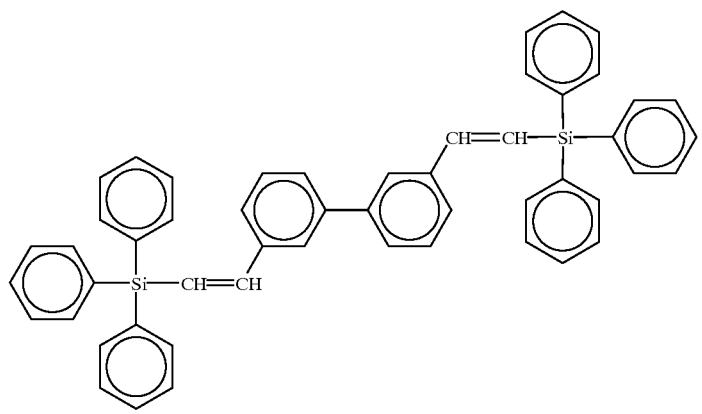

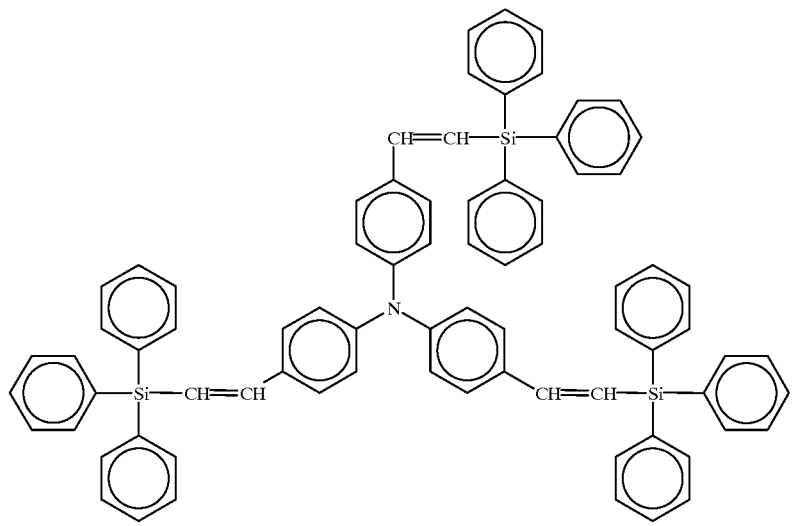
(1-16)
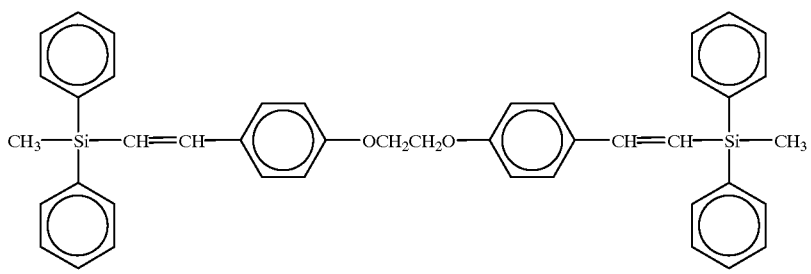
(1-17)
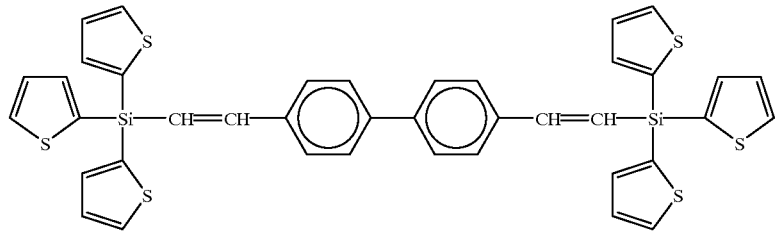
(1-18)
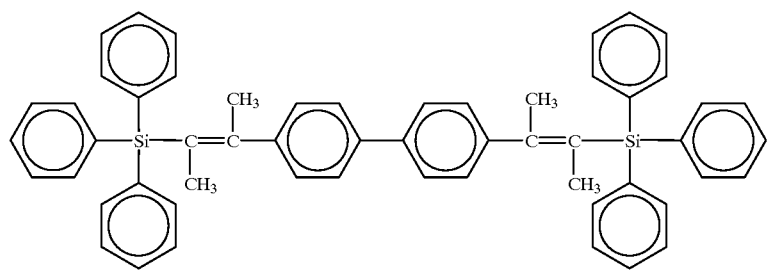
(1-19)

-continued
(1-20)
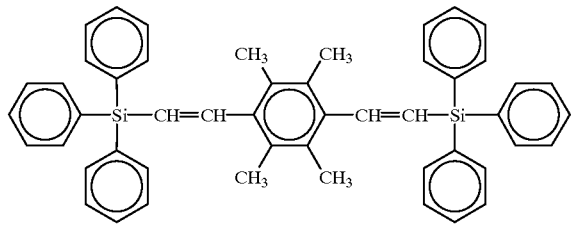
(1-21)
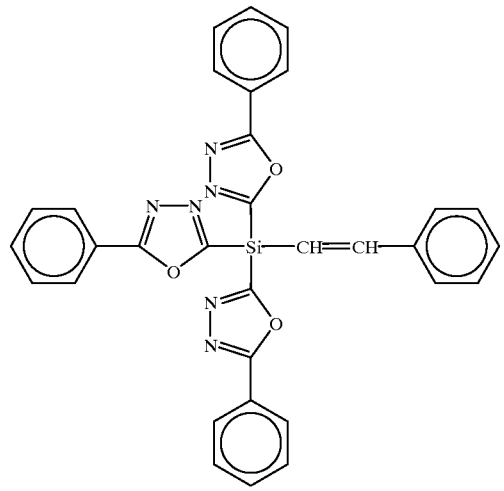
(1-22)
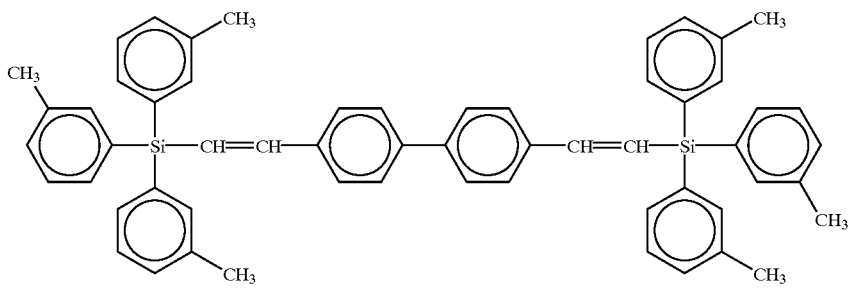
(1-23)
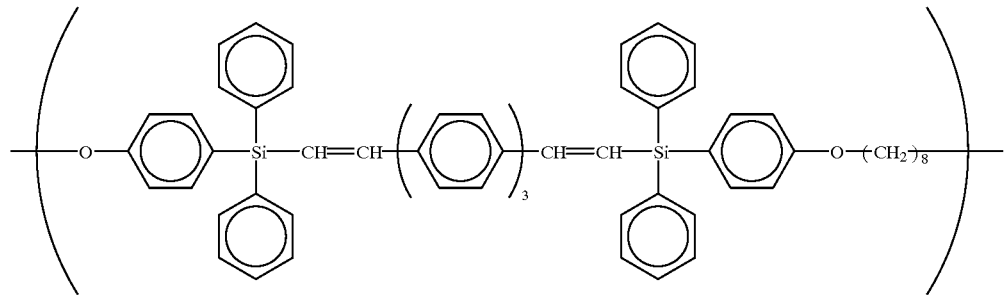
Mw = 9400
(1-24)
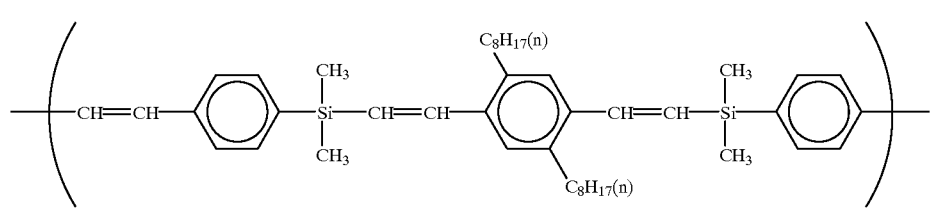
Mw = 8600

(1-25)
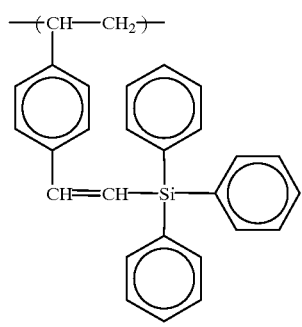
Mw = 12100
(1-26)
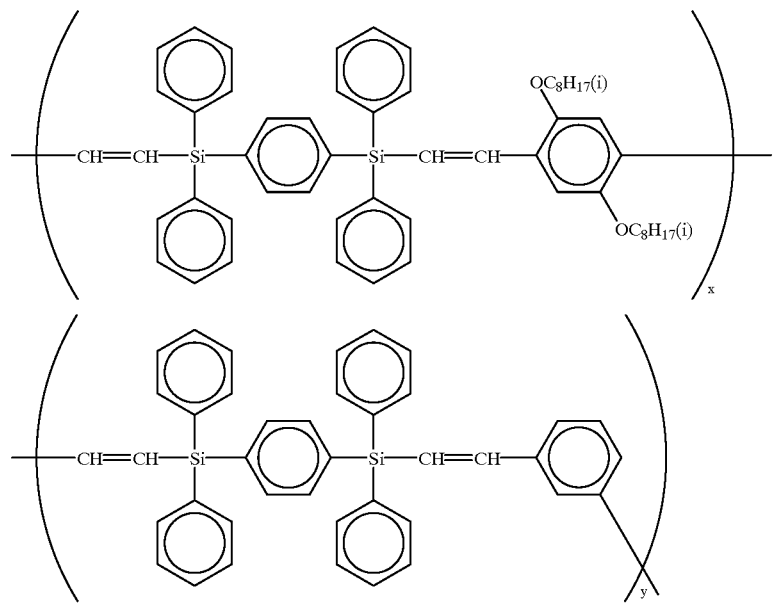
x/y = 4/1 (weight ratio)
Mw = 8200
(1-27)
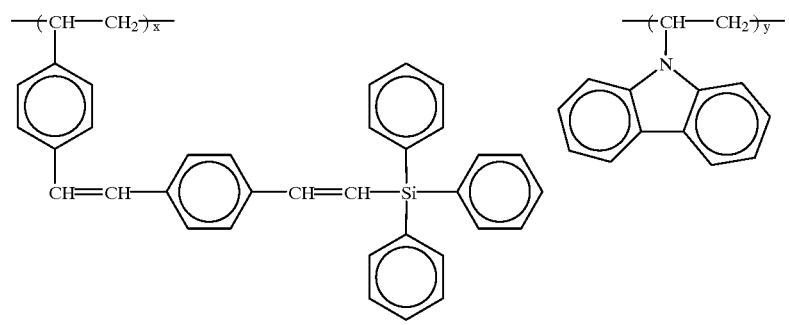
x/y = 1/20 (weight ratio)
Mw = 7600

(1-28)

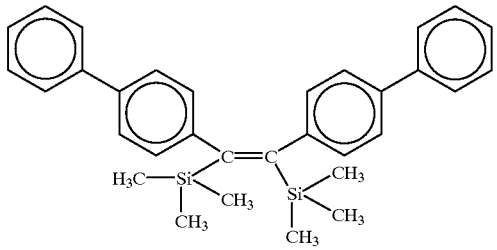

(1-29)

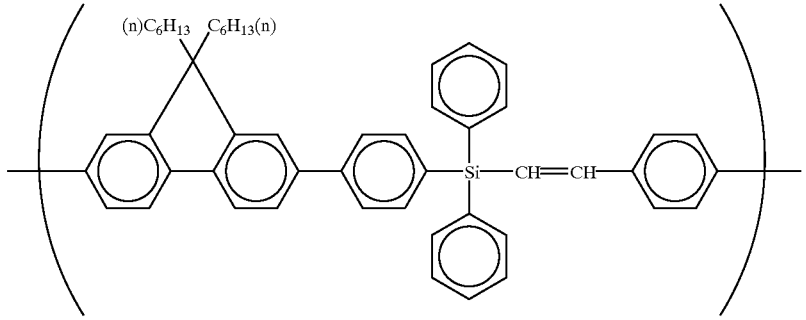

Mw = 6600

The compounds each having only one partial structure represented by general formula (2) are described below. The term "the compound having only one partial structure represented by general formula (2)" means that the compound is neither an oligomer nor a polymer.

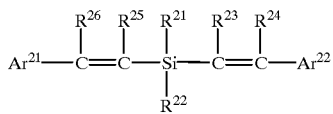

(2)

Then, general formula (2) is described below.

$R^{21}$ and $R^{22}$ each represents a hydrogen atom or a substituent group. Examples of the substituent groups include alkyl groups (each having preferably 1 to 20 carbon atoms, more preferably 1 to 12 carbon atoms, and particularly preferably 1 to 8 carbon atoms, for example, methyl, ethyl, i-propyl, t-butyl, n-octyl, n-decyl, n-hexadecyl, cyclopropyl, cyclopentyl and cyclohexyl), alkenyl groups (each having preferably 2 to 20 carbon atoms, more preferably 2 to 12 carbon atoms, and particularly preferably 2 to 8 carbon atoms, for example, vinyl, allyl, 2-butenyl and 3-pentenyl), alkynyl groups (each having preferably 2 to 20 carbon atoms, more preferably 2 to 12 carbon atoms, and particularly preferably 2 to 8 carbon atoms, for example, propargyl and 3-pentynyl), aryl groups (each having preferably 6 to 30 carbon atoms, more preferably 6 to 20 carbon atoms, and particularly preferably 6 to 12 carbon atoms, for example, phenyl, p-methylphenyl and naphthyl), substituted carbonyl groups (each having preferably 1 to 20 carbon atoms, more preferably 1 to 16 carbon atoms, and particularly preferably 1 to 12 carbon atoms, for example, acetyl, benzoyl, methoxycarbonyl, phenyloxycarbonyl, dimethylaminocarbonyl and phenylaminocarbonyl), amino groups (each having preferably 0 to 20 carbon atoms, more preferably 1 to 16 carbon atoms, and particularly preferably 1 to 12 carbon atoms, for example, dimethylamino, methylcarbonyl-amino, ethylsulfonylamino, dimethylaminocarbonylamino and phthalimido), sulfonyl groups (each having preferably 1 to 20 carbon atoms, more preferably 1 to 16 carbon atoms, and particularly preferably 1 to 12 carbon atoms, for example, mesyl and tosyl), sulfo, carboxyl, heterocyclic groups (aliphatic and aromatic heterocyclic groups, preferably containing any of oxygen, sulfur and nitrogen atoms, and each having preferably 1 to 50 carbon atoms, more preferably 1 to 30 carbon atoms, and particularly preferably 2 to 12 carbon atoms, for example, imidazolyl, pyridyl, furyl, piperidyl, morpholino, benzoxazolyl and triazolyl), hydroxyl, alkoxy groups (each having preferably 1 to 20 carbon atoms, more preferably 1 to 16 carbon atoms, and particularly preferably 1 to 12 carbon atoms, for example, methoxy and benzyloxy), aryloxy groups (each having preferably 6 to 20 carbon atoms, more preferably 6 to 16 carbon atoms, and particularly preferably 6 to 12 carbon atoms, for example, phenoxy and naphthyloxy), halogen atoms (preferably fluorine, chlorine, bromine and iodine), thiol, alkylthio groups (each having preferably 1 to 20 carbon atoms, more preferably 1 to 16 carbon atoms, and particularly preferably 1 to 12 carbon atoms, for example, methylthio), arylthio groups (each having preferably 6 to 20 carbon atoms, more preferably 6 to 16 carbon atoms, and particularly preferably 6 to 12 carbon atoms, for example, phenylthio) and cyano. These substituent groups may be further substituted.

$R^{21}$ and $R^{22}$ are each preferably an aryl group, a heteroaryl group, an alkenyl group or an alkynyl group, more preferably an aryl group or a heteroaryl group, still more preferably an aryl group, and particularly preferably unsubstituted phenyl.

$R^{23}$, $R^{24}$, $R^{25}$ and $R^{26}$ each represents a hydrogen atom or a substituent group. Examples of the substituent groups and preferred ranges thereof are the same as with $R^4$ described above.

$Ar^{21}$ and $Ar^{22}$ each represents an aryl group, a heteroaryl group or an alkenyl group. Preferred ranges thereof are the same as with $Ar^1$ described above.

Examples of the compounds each having only one partial structure represented by general formula (2) are shown below, but the present invention is not limited thereto.

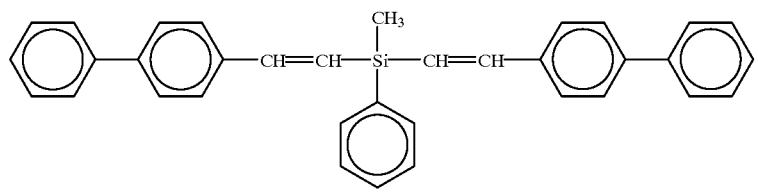
(2-1)
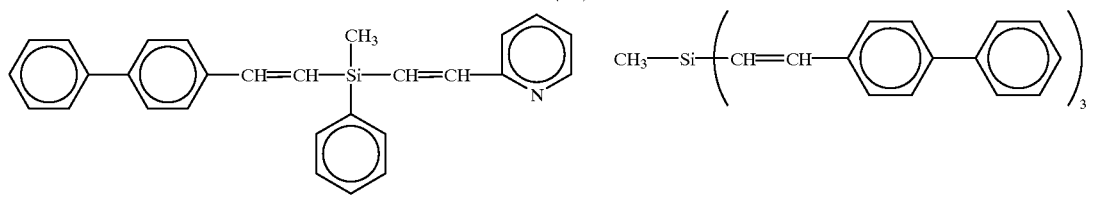
(2-2) (2-3)
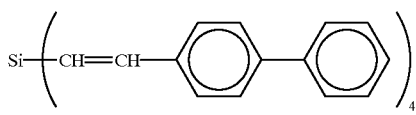
(2-4)
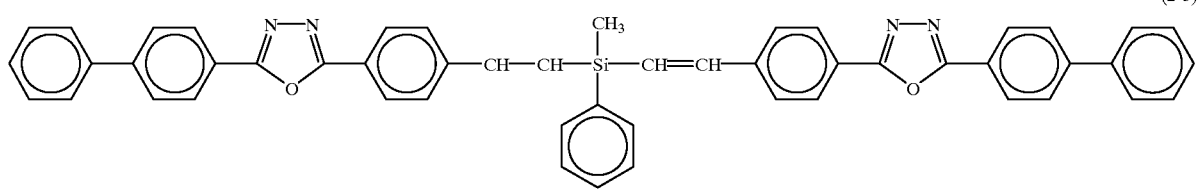
(2-5)
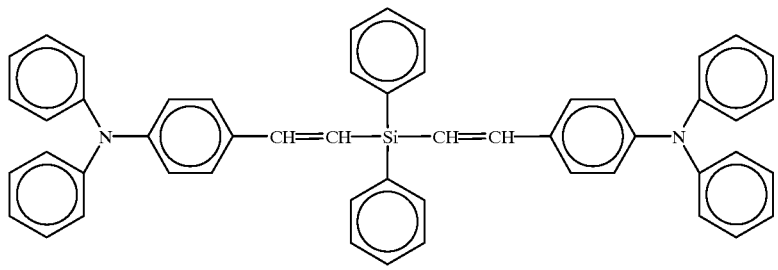
(2-6)
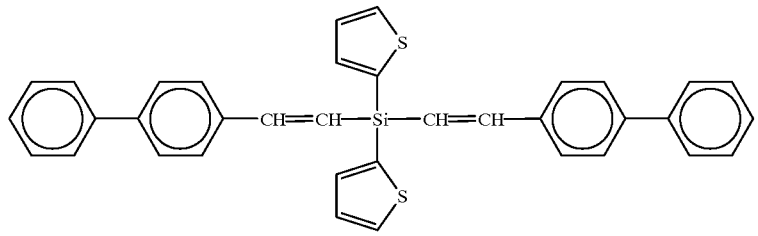
(2-7)

-continued

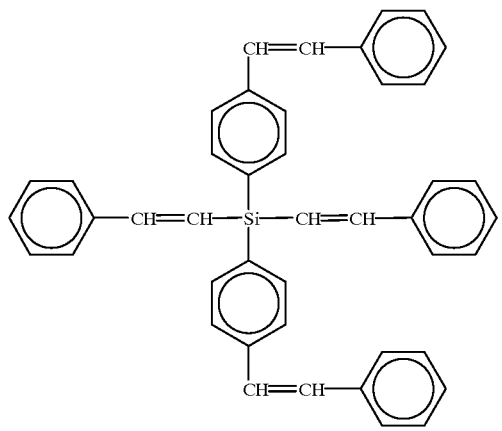
(2-8)

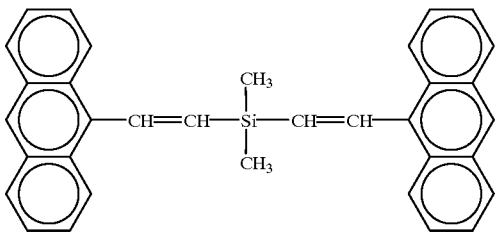
(2-9)

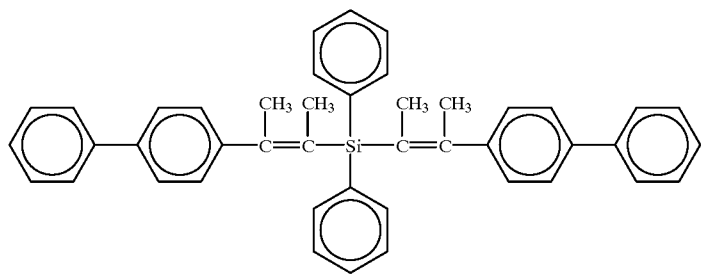
(2-10)

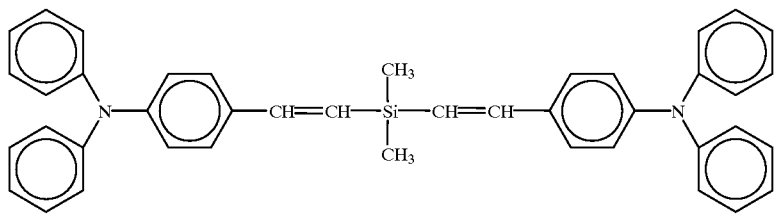
(2-11)

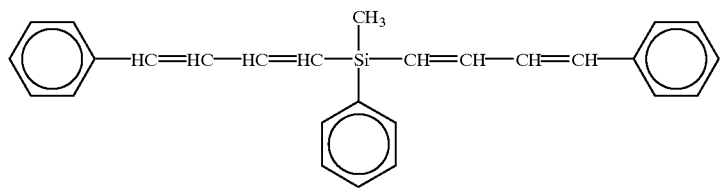
(2-12)

The compounds each having at least two partial structures represented by general formula (3) are described below. The term "the compound having at least two partial structures represented by general formula (3)" means that the compound is in a so-called oligomer or polymer form.

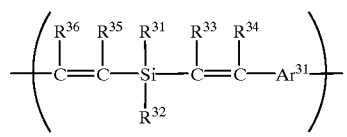
(3)

Then, general formula (3) is described below.

$R^{31}$ represents an aryl group, a heteroaryl group, an alkenyl group or an alkynyl group. $R^{31}$ is preferably an aryl group or a heteroaryl group, more preferably an aryl group, and still more preferably phenyl.

$R^{32}$ represents a hydrogen atom or a substituent group. The substituent groups include the groups described for $R^{31}$ mentioned above. $R^{32}$ is preferably an aryl group or a heteroaryl group, more preferably an aryl group, and still more preferably phenyl.

$R^{33}$, $R^{34}$, $R^{35}$ and $R^{36}$ each represents a hydrogen atom or a substituent group. $Ar^{31}$ represents an arylene group, a heteroarylene group or an alkenylene group, and preferred ranges thereof are the same as with $Ar^{41}$ described above.

It is preferred that the compound having at least two partial structures represented by general formula (3) has the partial structure represented by the above-mentioned general formula (6), together therewith.

Examples of the compounds each having at least two partial structures represented by general formula (3) are shown below, but the present invention is not limited thereto.

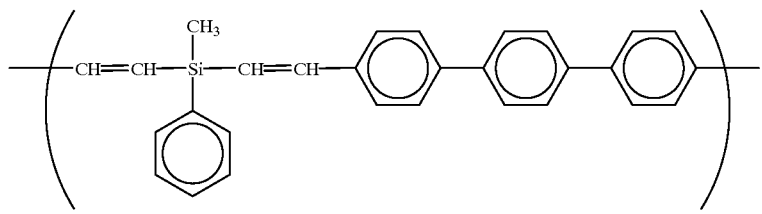
(3-1)
Mw = 4400
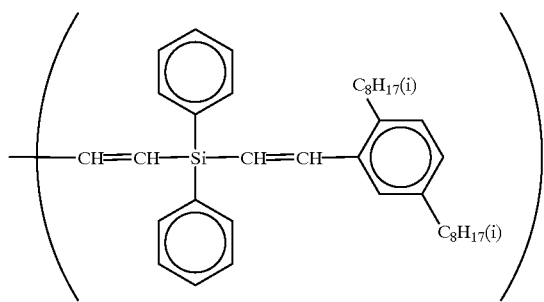
(3-2)
Mw = 4200
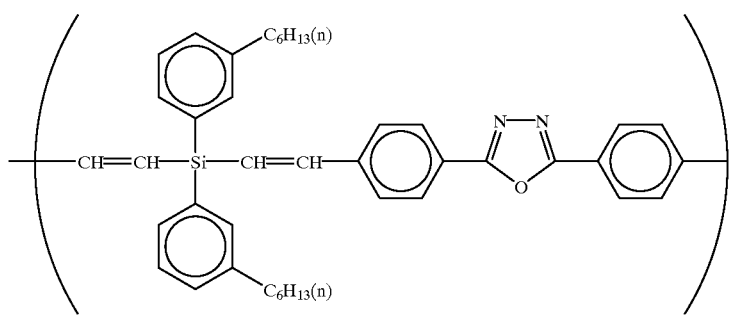
(3-3)
Mw = 6300
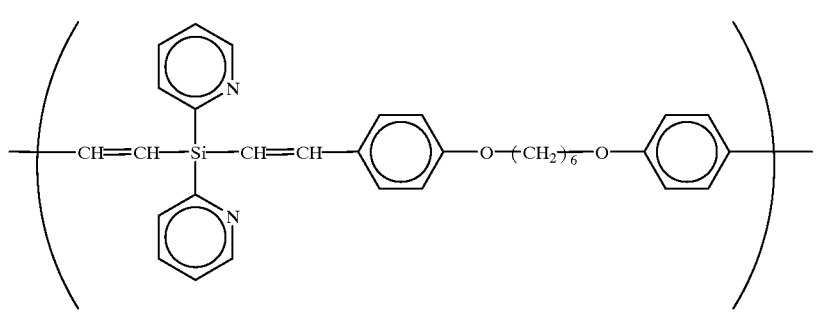
(3-4)
Mw = 4100

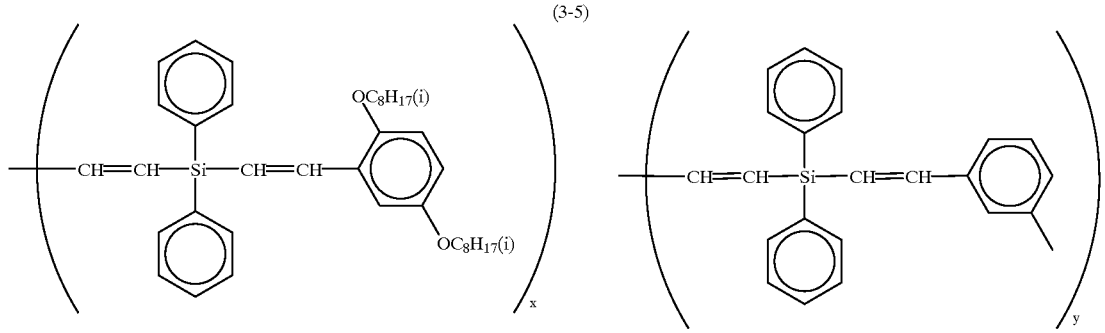

(3-5)

x/y + 1/1 weight ratio
Mw = 7200

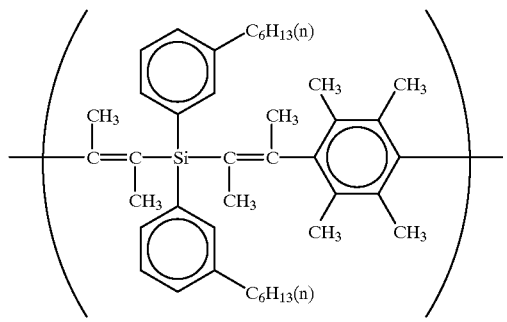

(3-6)

Mw = 6600

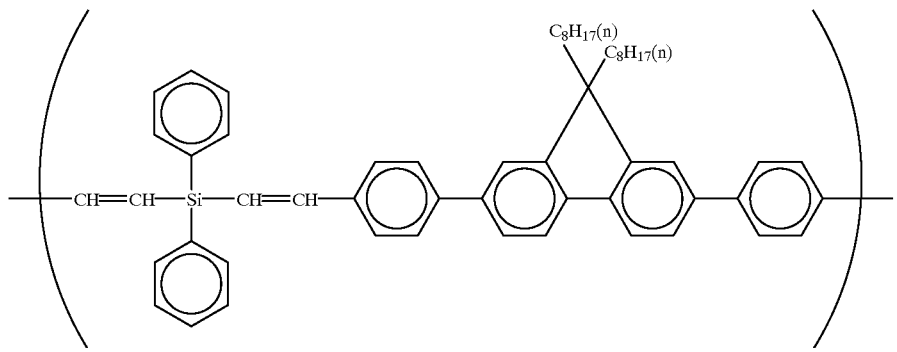

(3-7)

Methods for producing the compounds of the present invention are described below.

The compounds of the present invention can be synthesized by various methods. However, synthesis methods including procedures for forming carbon-carbon bonds using metallic catalysts are preferred, and synthesis methods including procedures for coupling vinylsilane derivatives with halide derivatives in the presence of palladium catalysts are more preferred. The compounds of the present invention can also be synthesized by hydrosilylation of alkynyl compounds and silane compounds in the presence of catalysts.

In respect to the palladium catalysts, there is no particular limitation on the valence and ligands. Examples thereof include tetrakis(triphenylphosphine)palladium, palladium carbon, palladium dichloride (dppf) (dppf: 1,1'-bis (diphenylphosphino)ferrocene) and palladium acetate. Ligands such as triphenylphosphine and phase transfer catalysts such as tetrabutylammonium bromide may be added together therewith.

In this reaction, bases are preferably used. There is no particular limitation on the kind of base used. Examples thereof include sodium carbonate, sodium acetate and triethylamine. Although there is no particular limitation on the amount of base used, it is preferably from 0.1 to 20 equivalents, and particularly preferably from 1 to 10 equivalents, based on the chloride.

In this reaction, solvents are preferably used. There is no particular limitation on the kind of solvent used. Examples thereof include ethanol, water, ethylene glycol dimethyl ether, diethylene glycol dimethyl ether, dimethylformamide, toluene, tetrahydrofuran, acetone and mixed solvents thereof.

The organic luminous elements containing the compounds of the present invention are described below. The organic luminous elements of the present invention are used without particular distinction of the system, the driving method and the form of utilization, as long as they are elements in which the compounds of the present invention are utilized. However, elements are preferred in which luminescence from the compounds of the present invention is utilized, or in which the compounds of the present invention are utilized as electron-transporting materials.

Typical examples of the organic luminous elements include organic EL (electroluminescence) elements.

The EL elements containing the compounds of the present invention are described below. There is no particular limitation on methods for forming organic layers of the EL elements containing the compounds of the present invention. However, methods such as resistance heating vapor deposition, electron beam, sputtering, molecular lamination and coating processes are used, and in respect to production, resistance heating vapor deposition and coating processes are preferred.

The luminous element of the present invention is an element in which a luminous layer or a plurality of organic compound thin layers including a luminous layer are formed between a pair of electrodes, an anode and a cathode, and may have a hole injection layer, a hole-transporting layer, an electron injection layer, an electron-transporting layer and a protective layer, in addition to the luminous layer. These respective layers may have other functions, respectively. For the formation of the respective layers, various materials can be used.

The anode supplies holes to the hole injection layer, the hole-transporting layer and the luminous layer. A metal, an alloy, a metal oxide, an electroconductive compound or a mixture thereof is used as the anode, and a material having a work function of 4 eV or more is preferred. Specific examples thereof include conductive metal oxides such as tin oxide, zinc oxide, indium oxide and indium tin oxide (ITO), metals such as gold, silver, chromium and nickel, mixtures or laminates of these metals and conductive metal oxides, inorganic conductive materials such as copper iodide and copper sulfide, organic conductive materials such as polyaniline, polythiophene and polypyrrole, and laminates of these and ITO. Conductive metal oxides are preferred, and ITO is particularly preferred from the viewpoints of productivity, high conductivity and transparency. The film thickness of the anode can be appropriately selected according to its material. However, the thickness usually preferably ranges from 10 nm to 5 $\mu$m, more preferably 50 nm to 1 $\mu$m, and still more preferably from 100 nm to 500 nm.

The anodes obtained by layer formation on soda lime glass, non-alkali glass or transparent resin substrates are usually employed. When glass is used, it is preferred that non-alkali glass is used for decreasing ions eluted from glass. When soda lime glass is used, it is preferred that silica or the like is applied as a barrier coat. There is no particular limitation on the thickness of the substrate, as long as it is sufficient to retain the mechanical strength. When glass is used, the thickness is usually 0.2 mm or more, and preferably 0.7 mm or more.

For the preparation of the anodes, various methods are employed depending on their material. For example, in the case of ITO, film formation is carried out by methods such as electron beam, sputtering, resistance heating vapor deposition, chemical reaction (sol-gel) and indium tin oxide dispersion coating processes.

The anodes can also decrease the driving voltage of the elements and increase the luminous efficiency by washing or other treatments. For example, in the case of ITO, an UV-ozone treatment and a plasma treatment are effective.

The cathode supplies electrons to the electron injection layer, the electron-transporting layer and the luminous layer, and is selected in consideration of the adhesion of the electron injection layer, the electron-transporting layer and the luminous layer to a layer adjacent to a negative electrode, the ionization potential and the stability. As a material for the cathode, a metal, an alloy, a metal halide, a metal oxide, an electroconductive compound or a mixture thereof can be used. Specific examples thereof include alkali metals (for example, Li, Na and K) and fluorides thereof, alkaline earth metals (for example, Mg and Ca) and fluorides thereof, gold, silver, lead, aluminum, sodium-potassium alloy and mixed metals thereof, lithium-aluminum alloy and mixed metals thereof, magnesium-silver alloy and mixed metals thereof, and rare earth metals such as indium and ytterbium. Materials having a work function of 4 eV or more are preferred, and aluminum, lithium-aluminum alloy and mixed metals thereof, and magnesium-silver alloy and mixed metals thereof are more preferred. The cathode can have not only the monolayer structure of the above-mentioned compounds and mixtures, but also the laminated structure containing the above-mentioned compounds and mixtures. The film thickness of the cathode can be appropriately selected according to its material. However, the thickness usually preferably ranges from 10 nm to 5 $\mu$m, more preferably from 50 nm to 1 Aim, and still more preferably from 100 nm to 1 $\mu$m.

For the preparation of the cathodes, methods such as electron beam, sputtering, resistance heating vapor deposition and coating processes are used. It is also possible to vapor deposit either a metal as a simple substance or two or more components at the same time. Further, it is also possible to vapor deposit a plurality of metals at the same time to form an alloy electrode, and an alloy previously prepared may be vapor deposited.

It is preferred that the anode and the cathode have lower sheet resistance, and the sheet resistance is preferably hundreds or less of ohms per square.

A material for the luminous layer may be any, as long as it can form a layer having a function of being able to inject holes from the anode or the hole injection layer and hole-transporting layer and to inject electrons from the cathode or the electron injection layer and the electron-transporting layer in the application of the electric field, a function of transporting charges injected, and a function of providing a field of recombination of the holes and the electrons to emit light. Although the luminous layer preferably contains the vinylsilane compound of the present invention, another luminous material can also be used. Examples of such luminous materials include various metal complexes represented by metal complexes and rare earth complexes of benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perynone derivatives, oxadiazole derivatives, aldazine derivatives, pyralidine derivatives, cyclopentadiene derivatives, bis-styrylanthracene derivatives, quinacridone derivatives, pyrrolopyridine derivatives, thiadiazolopyridine derivatives, cyclopentadiene derivatives, styrylamine derivatives, aromatic dimethylidine compounds and 8-quinolinol derivatives, and polymers such as polythiophene, polyphenylene and polyphenylenevinylene. Although there is no particular limitation on the thickness of the luminous layer, it usually preferably ranges from 1 nm to 5 $\mu$m, more preferably from 5 nm to 1 $\mu$m, and still more preferably from 10 nm to 500 nm.

There is no particular limitation on methods for forming the luminous layers. However, methods such as resistance heating vapor deposition, electron beam, sputtering, molecular lamination, coating (spin coating, casting and dip coating) and LB processes are used, and resistance heating vapor deposition and coating processes are preferred.

Materials for the hole injection layer and the hole-transporting layer may be any, as long as they have any of a function of injecting holes from the anode, a function of transporting holes injected and a function of forming a barrier against electrons injected from the cathode. Specific examples thereof include conductive polymeric oligomers such as carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, tertiary aromatic amine compounds, styrylamine compounds, aromatic dimethylidyne compounds, porphyrin compounds, polysilane compounds, poly(N-vinylcarbazole) derivatives, aniline copolymers, thiophene oligomers and polythiophene, and the vinylsilane compounds of the present invention. Although there is no particular limitation on the thickness of the hole injection layer and the hole-transporting layer, it usually preferably ranges from 1 nm to 5 μm, more preferably from 5 nm to 1 μm, and still more preferably from 10 nm to 500 nm. The hole injection layer and the hole-transporting layer may have either the monolayer structure comprising one or two or more of the above-mentioned materials, or the multilayer structure comprising a plurality of layers of the same composition or different compositions.

As methods for forming the hole injection layers and the hole-transporting layers, vacuum deposition and LB processes and methods for coating the above-mentioned hole injection transporting agents dissolved or dispersed in solvents (spin coating, casting and dip coating) are used. In the case of coating, the agents can be dissolved or dispersed together with resin components. The resin components include, for example, polyvinyl chloride, polycarbonates, polystyrene, polymethyl methacrylate, polybutyl methacrylate, polyesters, polysulfones, polyphenylene oxide, polybutadiene, poly(N-vinylcarbazole), hydrocarbon resins, ketone resins, phenoxy resins, polyamides, ethyl cellulose, vinyl acetate, ABS resins, polyurethanes, melamine resins, unsaturated polyester resins, alkyd resins, epoxy resins and silicone resins.

Materials for the electron injection layer and the electron-transporting layer may be any, as long as they have any of a function of injecting electrons from the cathode, a function of transporting electrons and a function of forming a barrier against holes injected from the anode. Specific examples thereof include various metal complexes represented by metal complexes of triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, heterocyclic tetracarboxilic acid anhydrides such as naphthalene perylene, phthalocyanine derivatives and 8-quinolinol derivatives, and represented by metal complexes having metallophthalocyanine, benzoxazole or benzothiazole as a ligand, and the vinylsilane compounds of the present invention. Although there is no particular limitation on the thickness of the electron injection layer and the electron-transporting layer, it usually preferably ranges from 1 nm to 5 μm, more preferably from 5 nm to 1 μm, and still more preferably from 10 nm to 500 nm. The electron injection layer and the electron-transporting layer may have either the monolayer structure comprising one or two or more of the above-mentioned materials, or the multilayer structure comprising a plurality of layers of the same composition or different compositions.

As methods for forming the electron injection layers and the electron-transporting layers, vacuum deposition and LB processes and methods for coating the above-mentioned hole injection transporting agents dissolved or dispersed in solvents (spin coating, casting and dip coating) are used. In the case of coating, the agents can be dissolved or dispersed together with resin components. As the resin components, for example, ones illustrated above for the hole injection and transporting layers can be applied.

A material for the protective layer may be any, as long as it has a function of inhibiting substances accelerating deterioration of the element such as water and oxygen from entering the element. Specific examples of such materials include metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, polyethylene, polypropylene, polymethyl methacrylate, polyimides, polyureas, polytetrafluoroethylene, polychlorotrifluoroethylene, polydichlorodifluoroethylene, copolymers of chlorotrifluoroethylene and dichlorodifluoro-ethylene, copolymers each obtained by copolymerizing a monomer mixture containing tetrafluoroethylene and at least one comonomer, fluorine-containing copolymers in which main chains thereof have the cyclic structure, water absorptive substances having a coefficient of water absorption of 1% or more and moisture-proof substances having a coefficient of water absorption of less than 1%.

There is also no particular limitation on methods for forming the protective layers. For example, vacuum deposition, sputtering, reactive sputtering, MBE (molecular beam epitaxy, cluster ion beam, ion plating, plasma polymerization (high-frequency excitation ion plating), plasma CVD, laser CVD, thermal CVD, gas source CVD and coating processes can be applied.

The present invention is described in greater detail with reference to the following Examples, but the invention should not be construed as being limited thereto.

Synthesis of Compound (2-1)

A divinylsilane derivative a (0.71 g), 1.9 g of bromobiphenyl b, 3.36 g of potassium carbonate, 2.6 g of tetrabutylammonium bromide, 0.05 g of palladium acetate and 20 ml of dimethylformamide were mixed, and heated with stirring at 80° C. for 6 hours. After the reaction was completed, the reaction solution was diluted with ethyl acetate and 1 N aqueous hydrochloric acid, and the organic phase was washed with water and a saturated salt solution. The organic solution was concentrated to produce a crude product, which was purified by column chromatography to obtain 0.42 g of white crystals. The formation of compound (2-1) was confirmed by the FAB-MAS spectrum. In the fluorescence spectrum, the λmax was 440 nm ($CHCl_3$).

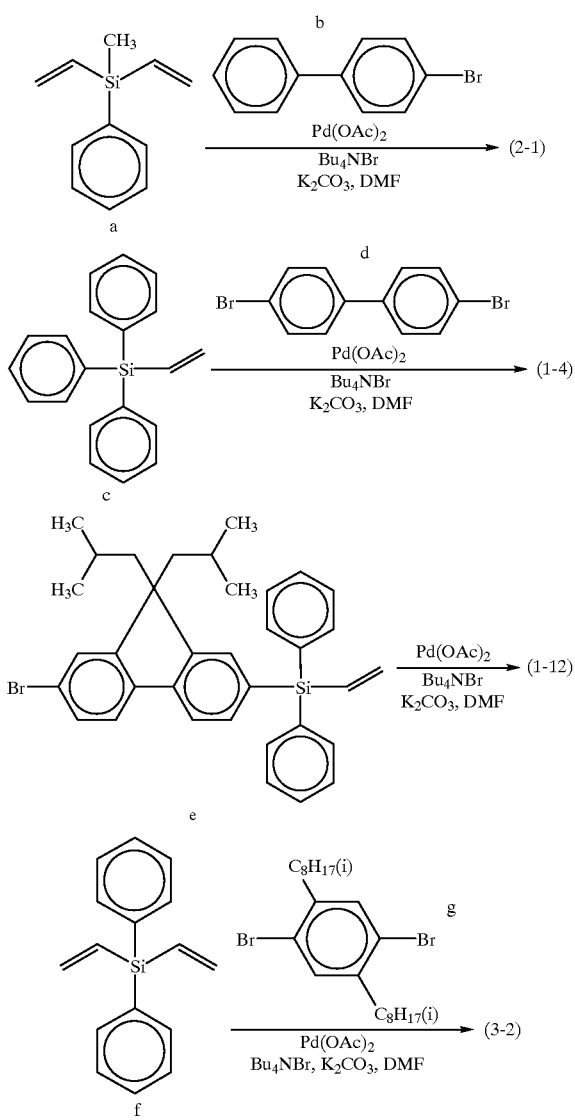

Synthesis of Compound (1-4)

A vinylsilane derivative c (20 g), 10.9 g of dibromobiphenyl d, 28.9 g of potassium carbonate, 22.5 g of tetrabutylammonium bromide, 0.5 g of palladium acetate and 100 ml of dimethylformamide were mixed, and heated with stirring at 80° C. for 6 hours. After the reaction was completed, the reaction solution was diluted with chloroform and 1 N aqueous hydrochloric acid, and the organic phase was washed with water. The organic solution was concentrated to produce a crude product, which was purified by column chromatography to obtain 11.2 g of yellow crystals. In the fluorescence spectrum, the λmax was 450 nm ($CHCl_3$).

Synthesis of Compound (1-12)

A vinylsilane derivative e (3 g), 2.2 g of potassium carbonate, 1.8 g of tetrabutylammonium bromide, 0.01 g of palladium acetate and 30 ml of dimethylformamide were mixed, and heated with stirring at 80° C. for 6 hours. After the reaction was completed, the reaction solution was diluted with ethyl acetate and 1 N aqueous hydrochloric acid, and the organic phase was washed with water and a saturated salt solution. The organic solution was concentrated to produce a crude product, which was reprecipitated twice with a chloroform/methanol system to obtain 1.5 g of whitish yellow crystals. The GPC measurement showed that the Mw was 4200 (in terms of polystyrene).

Synthesis of Compound (1-12)

A divinylsilane derivative f (1 g), 1.9 g of dibromobenzen derivative, 2.3 g of potassium carbonate, 2.4 g of tetrabutylammonium bromide, 0.02 g of palladium acetate and 30 ml of dimethylformamide were mixed, and heated with stirring at 80° C. for 6 hours. After the reaction was completed, the reaction solution was diluted with ethyl acetate and 1 N aqueous hydrochloric acid, and the organic phase was washed with water and a saturated salt solution. The organic solution was concentrated to produce a crude product, which was reprecipitated twice with a chloroform/methanol system to obtain 1.5 g of whitish yellow crystals. The GPC measurement showed that the Mw was 4200 (in terms of polystyrene).

Preparation and Evaluation of EL Element

COMPARATIVE EXAMPLE 1

Polyvinylcarbazole (40 mg), 12 mg of PBD (2-t-butylphenyl-4-biphenyl-1,3,4-oxadiazole) and 1 mg of the following compound A were dissolved in 2 ml of dichloroethane, and a washed ITO substrate was spin coated with the resulting solution to obtain a thin layer having a thickness of about 130 nm. A patterned mask (a mask giving a luminous area of 5 mm×5 mm) was placed on the organic thin layer, and magnesium/silver of 10/1 were codeposited over it to a thickness of 50 nm in a vapor deposition device, followed by vapor deposition of silver to a thickness of 50 nm. Using a source measure unit, type 2400, manufactured by Toyo Technica Corp., DC constant voltage was applied to the EL element to emit light. Then, the luminance thereof was measured with a BM-8 luminance meter manufactured by Topcon Corp., and the luminous wavelength was measured with a PMA-11 spectrum analyzer manufactured by Hamamatsu Photonics K.K. As a result, blue luminescence having an ELmax of 470 nm was obtained, and a luminance of 152 $cd/m^2$ was obtained at 19 V. The chromaticity was (x, y)=(0.18, 0.20).

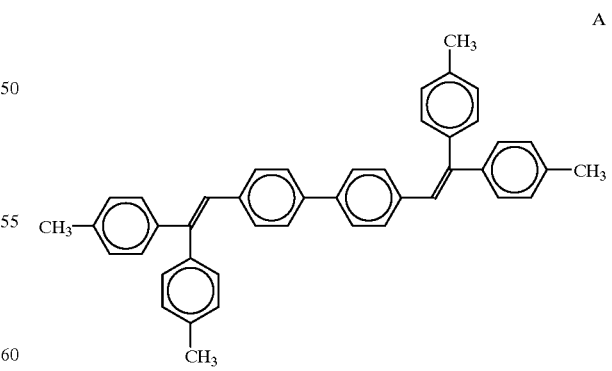

A

EXAMPLE 1

Polyvinylcarbazole (40 mg), 12 mg of PBD (2-t-butylphenyl-4-biphenyl-1,3,4-oxadiazole) and 1 mg of compound (2-1) were dissolved in 2 ml of dichloroethane, and a washed ITO substrate was spin coated with the resulting solution to obtain a thin layer having a thickness of about 130 nm. A patterned mask (a mask giving a luminous area of 5 mm×5 mm) was placed on the organic thin layer, and magnesium/silver of 10/1 were codeposited over it to a thickness of 50 nm in a vapor deposition device, followed by vapor deposition of silver to a thickness of 50 nm. Using a source measure unit, type 2400, manufactured by Toyo Technica Corp., DC constant voltage was applied to the EL element to emit light. Then, the luminance thereof was measured with a BM-8 luminance meter manufactured by Topcon Corp., and the luminous wavelength was measured with a PMA11 spectrum analyzer manufactured by Hamamatsu Photonics K.K. As a result, blue luminescence in which ELmax=418, 437 nm was obtained, and a luminance of 175 cd/M$^2$ was obtained at 21 V. The chromaticity was (x, y)=(0.17, 0.16).

EXAMPLE 2

Polyvinylcarbazole (40 mg), 12 mg of PBD (2-t-butylphenyl-4-biphenyl-1,3,4-oxadiazole) and 1 mg of compound (2-1) were dissolved in 3 ml of dichloroethane, and a washed ITO substrate was spin coated with the resulting solution to obtain a thin layer having a thickness of about 50 nm. This was placed in a vapor deposition device. TAZ (1-phenyl-2-t-butylphenyl-5-biphenyltriazole) was vapor deposited over it to a thickness of 20 nm and Alq (aluminum quinolinato complex) to a thickness of 40 nm. A patterned mask (a mask giving a luminous area of 5 mm×5 mm) was placed on the organic thin layer, and magnesium/silver of 10/1 were codeposited over it to a thickness of 50 nm in the vapor deposition device, followed by vapor deposition of silver to a thickness of 50 nm. Evaluation was conducted in the same manner as with Example 1. As a result, similar blue luminescence was obtained, and the luminance thereof was 391 cd/m$^2$ at 15 V.

EXAMPLE 3

A washed ITO substrate was placed in a vapor deposition device, and TPD (N,N'-diphenyl-N,N'-di(m-tolyl)benzidine) was vapor deposited over the substrate to a thickness of 40 nm. Compound (1-4) was vapor deposited thereon to a thickness of 20 nm, and Alq (tris(8-hydroxyquinolinato) aluminum complex) was further vapor deposited thereon. A patterned mask (a mask giving a luminous area of 5 mm×5 mm) was placed on the organic thin layer, and magnesium/silver of 10/1 were codeposited over it to a thickness of 50 nm in the vapor deposition device, followed by vapor deposition of silver to a thickness of 50 nm.

Evaluation was conducted in the same manner as with Example 1. As a result, luminescence having an ELmax of 480 nm (0.19, 0.31) was obtained, and the luminance thereof was 7640 cd/m$^2$ at 16 V.

EXAMPLE 4

A washed ITO substrate was placed in a vapor deposition device, and TPD (N,N'-diphenyl-N,N'-di(m-tolyl)benzidine) was vapor deposited over the substrate to a thickness of 40 nm, and compound (1-4) was further vapor deposited thereon to a thickness of 60 nm. A patterned mask (a mask giving a luminous area of 5 mm×5 mm) was placed on the organic thin layer, and magnesium/silver of 10/1 were codeposited over it to a thickness of 50 nm in the vapor deposition device, followed by vapor deposition of silver to a thickness of 50 nm.

Evaluation was conducted in the same manner as with Example 1. As a result, luminescence having an ELmax of 470 nm (0.16, 0.20) was obtained, and the luminance thereof was 1220 cd/m$^2$ at 16 V.

Similarly, an EL element containing a vinylsilane compound of the present invention was prepared and evaluated. As a result, it could be confirmed that the compound of the present invention functioned as a blue luminous material or an electron-transporting material.

The vinylsilane compounds of the present invention function as the blue luminous materials for organic EL or the electron-transporting materials, and the elements containing the compounds of the present invention are excellent in EL characteristics such as hue and luminance. The compounds of the present invention are also applicable to medical use, fluorescent brightening agents, photographic materials, UW absorbing materials, laser dyes, color filter dyes and color changing filters.

While the invention has been described in detail and with reference to specific examples thereof, it will be apparent to one skilled in the art that various changes and modifications can be made therein without departing from the spirit and scope thereof.

What is claimed is:

1. A compound represented by general formula (4):

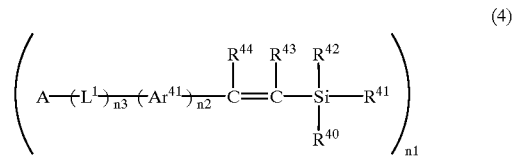

wherein $R^{40}$, $R^{41}$, $R^{42}$, $R^{43}$ and $R^{44}$ each represents a hydrogen atom or a substituent group; $Ar^{41}$ represents an arylene group, a heteroarylene group or an alkenylene group; $L^1$ represents a divalent connecting group; A represents a connecting group; $n^1$ represents an integer of 2 or more; when $n^1$ is 2, A may be connected through single bonds; a plurality of substituent groups (groups each having a vinylsilyl structure) connected to A may be the same or different; $n^2$ represents 0 or 1, with the proviso that only when A is an aryl connecting group, a heteroaryl connecting group or an alkenyl connecting group and $n^3$ is 0, $n^2$ can be 0; and $n^3$ represents an integer of 0 or more.

2. A compound comprising at least two partial structures represented by general formula (5):

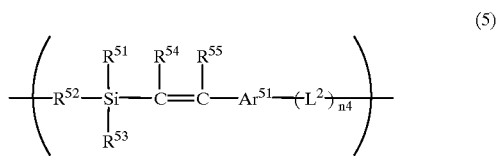

wherein $R^{51}$ and $R^{53}$ each represents a hydrogen atom or a substituent group; $R^{52}$ represents a divalent connecting group; $R^{54}$ and $R^{55}$ each represents a hydrogen atom or a substituent group; $Ar^{51}$, represents an arylene group, a heteroarylene group or an alkenylene group; $L^2$ represents a divalent connecting group; and $n^4$ represents an integer of 0 or more.

3. A compound containing:

at least one partial structure represented by general formula (1):

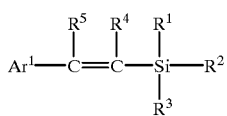
(1)

wherein $R^1$, $R^2$ and $R^3$ each represents a hydrogen atom or a substituent group, with the proviso that $R^1$, $R^2$ and $R^3$ are not alkenyl groups; $R^4$ and $R^5$ each represents a hydrogen atom or a substituent group; and $Ar^1$ represents an aryl group, a heteroaryl group or an alkenyl group; and at lease one partial structure represented by general formula (6):

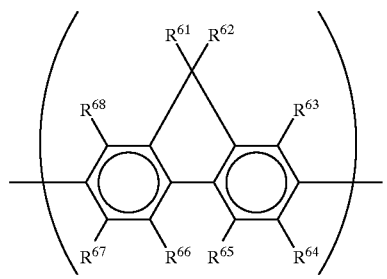
(6)

wherein $R^{61}$, $R^{62}$ $R^{63}$, $R^{64}$, $R^{65}$, $R^{66}$, $R^{67}$ and $R^{68}$ each represents a hydrogen atom or a substituent group.

4. A method for producing a vinylsilane compound, which comprises:

reacting a vinylsilane derivative with an aryl halide derivative, a heteroaryl halide derivative, a trifluoromethanesulfonylaryl derivative or a trifluoromethanesulfonylheteroaryl derivative in the presence of a palladium catalyst to form a carbon-carbon bond, to thereby obtain a compound represented by general formula (A):

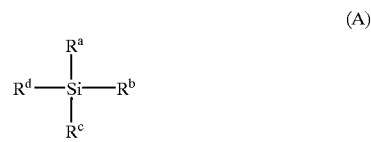
(A)

wherein $R^a$, $R^b$, $R^c$ and $R^d$ each represents a hydrogen atom or a substituent group, with the proviso that at least one substituent group of $R^a$, $R^b$, $R^c$ and $R^d$ is a group represented by general formula (B):

(B)

wherein $R^e$ and $R^f$ each represents a hydrogen atom or a substituent group, and $Ar^a$ represents an aryl group, a heteroaryl group or an alkenyl group; and when at least two substituent groups of $R^a$, $R^b$, $R^c$ and $R^d$ are groups represented by general formula (B), the groups represented by general formula (B) may be the same or different.

* * * * *